(12) United States Patent
Frohberg et al.

(10) Patent No.: US 8,941,182 B2
(45) Date of Patent: Jan. 27, 2015

(54) BURIED SUBLEVEL METALLIZATIONS FOR IMPROVED TRANSISTOR DENSITY

(75) Inventors: Kai Frohberg, Niederau (DE); Dominik Olligs, Dresden (DE); Jens Heinrich, Wachau (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 414 days.

(21) Appl. No.: 13/154,548

(22) Filed: Jun. 7, 2011

(65) Prior Publication Data

US 2012/0313176 A1 Dec. 13, 2012

(51) Int. Cl.
| | |
|---|---|
| H01L 27/088 | (2006.01) |
| H01L 21/8234 | (2006.01) |
| H01L 21/768 | (2006.01) |
| H01L 21/8238 | (2006.01) |

(52) U.S. Cl.
CPC .. *H01L 21/823475* (2013.01); *H01L 21/76895* (2013.01); *H01L 21/76801* (2013.01); *H01L 21/76816* (2013.01); *H01L 21/823871* (2013.01)
USPC .............. 257/368; 257/E21.557; 257/E27.06; 438/637

(58) Field of Classification Search
CPC ................ H01L 2924/00; H01L 2224/73265; H01L 2224/32225; H01L 2224/48227; H01L 2224/73204; H01L 2224/97; H01L 21/76897; H01L 27/105; H01L 27/10852; H01L 27/10873; H01L 27/10894; H01L 27/10897
USPC ................... 257/347, 368, E21.561, E21.585, 257/E21.586, E21.577, E27.06, E21.573, 257/E21.703, E27.112, E21.648, E21.654, 257/E21.214, E21.661, 296, E21.002, 257/E21.627, 306, E21.215, E21.249, 257/E21.409, E23.01, E21.421, E21.538; 438/586, 637, 620, 638, 675, 692, 275, 438/396, 149, 238, 253
See application file for complete search history.

(56) References Cited

U.S. PATENT DOCUMENTS

| | | | | |
|---|---|---|---|---|
| 6,677,650 | B2 * | 1/2004 | Fischer et al. | 257/382 |
| 7,220,665 | B2 * | 5/2007 | Farrar | 438/622 |
| 7,535,103 | B2 * | 5/2009 | Farrar | 257/750 |
| 7,605,025 | B2 * | 10/2009 | Kim et al. | 438/151 |
| 7,993,949 | B2 * | 8/2011 | Perruchot et al. | 438/50 |
| 2006/0006444 | A1 * | 1/2006 | Leslie | 257/300 |
| 2006/0006548 | A1 * | 1/2006 | Farrar | 257/774 |
| 2006/0011586 | A1 * | 1/2006 | Shea | 216/95 |
| 2007/0099360 | A1 * | 5/2007 | Lee et al. | 438/197 |
| 2008/0054481 | A1 * | 3/2008 | Jones et al. | 257/773 |
| 2010/0314684 | A1 * | 12/2010 | Sonsky et al. | 257/347 |
| 2011/0278680 | A1 * | 11/2011 | Tews et al. | 257/392 |
| 2012/0235969 | A1 * | 9/2012 | Burns et al. | 345/211 |

* cited by examiner

*Primary Examiner* — Stephen W Smoot
*Assistant Examiner* — Edward Chin
(74) *Attorney, Agent, or Firm* — Amerson Law Firm, PLLC

(57) ABSTRACT

Generally, the subject matter disclosed herein relates to modern sophisticated semiconductor devices and methods for forming the same, wherein electrical interconnects between circuit elements based on a buried sublevel metallization may provide improved transistor density. One illustrative method disclosed herein includes forming a contact dielectric layer above first and second transistor elements of a semiconductor device, and after forming the contact dielectric layer, forming a buried conductive element below an upper surface of the contact dielectric layer, the conductive element providing an electrical connection between the first and second transistor elements.

17 Claims, 7 Drawing Sheets

US 8,941,182 B2

BURIED SUBLEVEL METALLIZATIONS FOR IMPROVED TRANSISTOR DENSITY

BACKGROUND

1. Field of the Disclosure

Generally, the present disclosure relates to sophisticated integrated circuits, and, more particularly, to forming electrical interconnects between circuit elements in semiconductor device areas of high transistor density.

2. Description of the Related Art

Semiconductor devices, such as advanced integrated circuits, typically contain a large number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are sometimes referred to as metallization layers, or metallization systems. These metallization layers generally include substantially horizontally oriented conductive lines, which are typically formed of highly conductive metals and provide intra-level electrical connections—i.e., within the plane of a given metallization layer. Additionally, metallization layers may also include a plurality of substantially vertically oriented conductive connections, sometimes referred to as contact "vias," that may also be filled with an appropriate highly conductive metal, and which provide inter-level electrical connections—i.e., between the planes of two neighboring stacked metallization layers.

In state-of-the-art semiconductor technologies, electrical connections, or interconnects, between the various circuit elements of a semiconductor device, such as transistors, capacitors, resistors, diodes, and the like, are typically established by connecting the circuit elements with the "wiring" components of the metallization layers. These interconnects are accomplished through a vertical contact structure, or contact layer, that is typically provided between the circuit elements formed in and above a semiconductor substrate and the metallization layers thereabove. The contact layer may include a plurality of vertical contact elements, such as contact vias, which connect the respective contact regions of a given circuit element—such as a gate electrode and/or the drain/source regions of a transistor element—to a respective metal line in the first metallization layer. Typically, the contact vias comprising the contact layer are formed in an inter-layer dielectric material that encloses and passivates the circuit elements. FIG. 1 depicts one prior art method of providing electrical interconnects between illustrative transistor elements of a semiconductor device, and will now be described.

FIG. 1 schematically shows a cross-sectional view of an illustrative prior art semiconductor device 100 that includes a MOS transistor elements 150a-d in an advanced manufacturing stage, wherein a first metallization layer has already been formed. The semiconductor device 100 of FIG. 1 may also include a substrate 101, in and above which the illustrative transistor elements 150a-d may be formed based on well-established semiconductor device processing techniques. For example, the transistor elements 150a-d each may include a gate electrode structure 125, and the substrate 101 may represent any appropriate substrate which may contain or on which may be formed a semiconductor layer 103, such as a silicon-based layer, or any other appropriate semiconductor material that may facilitate the formation of the MOS transistor elements 150a-d. It should be appreciated that the semiconductor layer 103, even if provided as a silicon-based layer, may include other materials, such as germanium, carbon, and the like, in addition to an appropriate dopant species for establishing the requisite conductivity types in each of the active regions 102a-d of the semiconductor layer 103. Furthermore, in some illustrative embodiments, the transistor element 150 may be formed as one of a plurality of bulk transistors, i.e., the semiconductor layer 103 may be formed on or be part of a substantially crystalline substrate material, while in other cases specific device regions of the device 100 or the entire device 100 may be formed on the basis of a silicon-on-insulator (SOI) architecture, in which a buried insulating layer (not shown) may be provided below the semiconductor layer 103.

As shown in FIG. 1, the active regions 102a-d may typically be enclosed by an isolation structure 104, which in the present example may be provided in the form of a shallow trench isolation that is typically used for sophisticated integrated circuits. In the illustrated device, highly doped source regions 105 and drain regions 106, which in some cases may also include lightly doped extension regions, are formed in each of the active regions 102a-d, corresponding to each of the transistor elements 150a-d, respectively. The source and drain regions 105, 106, including any extension regions, are laterally separated by a channel region 107. Furthermore, the source and drain regions 105, 106 may also include, among other things, metal silicide contact regions (not shown), which may facilitate the formation of electrical contacts to one or more of the transistor elements 150a-d. Each of the gate electrode structures 125 are formed above the channel regions 107 of the respective transistor elements 150a-d, and include a gate electrode 109, which is separated from the underlying channel region 107 by a gate dielectric layer 108. Additionally, depending on the overall device requirements and the process flow used to form the transistor elements 150a-d, the gate electrode structures 125 may also include sidewall spacer structures 110 on or adjacent to the sidewalls of the gate electrode 109. Depending on the device requirements and/or the process strategy, a transistor may include one, two, or even more spacer elements, such as offset spacers, conformal liners, and the like, which may act as appropriate implantation masks for creating the lateral dopant profile for the highly doped drain and source regions 105, 106, as well as any lightly doped extension regions.

Depending on the specific requirements of the semiconductor device 100, the transistor elements 150a-d may be spaced at a gate electrode pitch 161 of less than 100 nm, and in certain applications may be even be spaced at 80 nm or less. Moreover, each of the transistor elements 150a-d may in some cases be substantially similar in design and configuration, whereas in other cases one or more of the transistor elements 150a-d may be of a substantially different design. For example, in some instances all of the transistor elements 150a-d may be of the same conductivity type, such as NMOS or PMOS transistors, and furthermore may all be formed based upon the same integration process. In other instances, the transistor elements 150a-d may be based upon CMOS device architecture, wherein pairs of transistor elements are made up of one each of an NMOS transistor and a PMOS transistor. Additionally, in some designs, one or more of the gate electrode structures 125 may be based upon conventional gate electrode configurations—sometimes referred to as "polySiON" configurations—wherein the gate electrode 109 is generally formed from polysilicon material, and the gate dielectric layer 108 is formed from an oxide, such as silicon dioxide, silicon oxynitride, and the like. On the other hand, in other designs, some of the gate electrode structures 125 may be based on more advanced materials, which may include high-k gate dielectric materials (i.e., materials having a dielectric constant "k" greater than approximately 10, such as hafnium oxide, tantalum oxide, titanium oxide, and the like) and highly conductive metal gate electrode materials (such as titanium, titanium nitride, titanium-aluminum, tantalum, and the like), which, in combination, is sometimes referred to as a high-k dielectric/metal gate stack, or "HK/MG" gate electrode configuration.

The semiconductor device 100 may also include an interlayer dielectric (ILD) material layer 111, sometimes also referred to as a contact dielectric layer 111, which typically serves to electrically isolate the transistor elements 150a-d from any subsequently formed metallization layers, such as the first metallization layer 119 shown in FIG. 1. The contact dielectric layer 111 may include one or more of several well-known conventional silicon-based dielectric materials, such as silicon dioxide, silicon nitride, silicon oxynitride, and the like. Depending on the device design and overall process flow requirements, the contact dielectric layer 111 may also include suitably selected low-k dielectric materials, such as porous silicon dioxide, organic polyimides, or organosilicates such as methyl silsesquioxane (MSQ) and the like, wherein it should be understood that a low-k dielectric material may be considered as a material having a k-value that is approximately 3 or less.

In the illustrative semiconductor device 100 depicted in FIG. 1, the contact dielectric layer 111 includes a first conformal dielectric material layer 111a and a second dielectric material layer 111b. In certain cases, the first dielectric material layer 111a may act as an etch stop layer when forming contact elements—such as contact vias 117a-d shown in FIG. 1—to the various contact regions of each transistor element 150a-d, wherein the composition of the first dielectric material layer 111a is exhibits a substantially different etch rate as compared to the material of the second dielectric material layer 111b. For example, when the second dielectric material layer 111b makes up the bulk of the contact dielectric layer 111 and includes, for example, silicon dioxide, then the first dielectric material layer 111a may also include, for example, silicon nitride, which exhibits etch selectivity relative to silicon dioxide.

As noted, the semiconductor device 100 of FIG. 1 also includes a plurality of contact vias 117a-d, each of which form a substantially vertically oriented conductive path between the conductive lines 120a-d of the first metallization layer 119 and the gate electrodes 109 of each of the transistor elements 150a-d. Depending on specific device requirements, the contact vias 117a-d may include of one or more highly conductive metal materials, such as, for example, tungsten and the like. Furthermore, in some cases a liner or barrier layer (not shown) may be formed on the sidewalls of the via openings, between the contact vias 117a-d and the materials making up the contact dielectric layer 111, so as to promote contact element adhesion, and/or prevent material diffusion, as is well understood by those having ordinary skill in the art.

FIG. 1 also schematically depicts a first metallization layer 119 formed above the contact dielectric layer 111. An etch stop or hard mask layer (not shown) may also be present between contact dielectric layer 111 and the first metallization layer 119, which, depending on the device integration requirements, may be used to facilitate the planarization of the contact dielectric layer 111 after the contact vias 117a-d have been formed. The first metallization layer 119 may be formed of any one of several suitable dielectric materials well known in the art, such as silicon dioxide, silicon oxynitride, or even low-k dielectric materials. Furthermore, the first metallization layer 119 may include a plurality of substantially horizontally oriented "wiring" elements, such as the conductive lines 120a-d, which, depending on the overall circuit design, may be configured and routed through the first metallization layer 119 so as to provide electric connections between the various circuit elements making up the semiconductor device 100. In many integrated circuits based on advanced device integration schemes, the conductive lines 120a-d may include highly conductive metals, such as copper and copper alloys. As those skilled in the art know, the processing of wiring elements based on copper and copper alloys is typically based on the so-called damascene technique, wherein a series of sophisticated photolithography and etching steps are used to form openings in a dielectric material layer, which define the size and extent of a wiring circuit. Thereafter, the openings are filled using electrochemical deposition processes, such as electroplating and the like.

As noted above, the first metallization layer 119 may typically include a plurality of interconnects between a variety of integrated circuit elements. For example, as shown in FIG. 1, a conductive line 120a may be formed in the first metallization layer 119 so as to provide a direct electrical connection between the gate electrodes 109 of transistor elements 150a and 150b. This type of direct gate electrode-to-gate electrode connection is typical in certain semiconductor devices, such as, for example, a 6T (six transistor) static random-access memory (SRAM) chip, the circuit layout of which may require a direct connection between the gate electrode of a PMOS pull-up transistor and the gate electrode of an NMOS pull-down transistor. Therefore, in FIG. 1, the conductive line 120a may be representative of an electrical interconnect between the gate electrodes of a pair of transistor elements of a first inverter of a 6T SRAM memory cell, in which case, the transistor element 150a may represent, e.g., an NMOS pull-down transistor, and the transistor element 150b may represent, e.g., a PMOS pull-up transistor.

In addition to the conductive line 120a that provides a direct interconnect between the gate electrodes 109 of the transistor elements 150a and 150b, the first metallization layer 119 may also include a plurality of additional conductive lines, such as the conductive lines 120b, 120c and 120d, which may provide further electrical interconnects to other circuit elements of the semiconductor device 100. However, due to some device design and operating parameters, such as power requirements, current density, and the like, a minimum spacing 162 may need to be established between adjacent conductive lines so as to limit undue parasitic capacitance effects. Accordingly, depending on the overall circuit layer and conductive line density requirements, the minimum spacing 162 between adjacent conductive lines may have a substantial influence on the gate electrode pitch 161.

It should be appreciated that, in view of the continued and ongoing success within the semiconductor processing industry of reducing the physical size of semiconductor elements so as to increase device performance, and to fit more devices on a given chip area, inherent limitations on the spacing between adjacent conductive lines within a given metallization layer is becoming of increased importance. For example, as devices generally become smaller, the spacing between devices also becomes smaller, device density increases, and less real estate is available in a given metallization layer within which to route the requisite number electrical interconnects. In particular, in chip areas having a very high density of transistor elements, such as the aforementioned SRAM memory devices, and the like, the first metallization layer—wherein the connections to the various circuit elements is initially established—may also include a very high density of conductive lines. As the conductive lines become more closely spaced, the problems associated with parasitic capacitance between adjacent lines may become more pronounced, metal-to-metal leakage current may increase, and overall device degradation may occur. These factors may in turn have a significant effect on overall device performance and reliability.

Accordingly, there is a need to implement new design strategies to address the manufacturing and performance issues associated with electrical interconnects in areas of high semiconductor device density. The present disclosure relates to process schemes and devices that are directed to avoiding, or at least mitigating, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to modern sophisticated semiconductor devices and methods for forming the same, wherein electrical interconnects between circuit elements based on a buried sublevel metallization may provide improved transistor density. One illustrative method disclosed herein includes forming a contact dielectric layer above first and second transistor elements of a semiconductor device, and after forming the contact dielectric layer, forming a buried conductive element below an upper surface of the contact dielectric layer, the conductive element providing an electrical connection between the first and second transistor elements.

Also disclosed herein is a method that includes, among other things, forming a first layer of a contact dielectric layer above a plurality of transistor elements of a semiconductor device, each of the plurality of transistor elements comprising a gate electrode. The disclosed method also includes planarizing the first layer to expose an upper surface of the gate electrode of at least two of the plurality of transistor elements, forming a sacrificial material layer above the planarized first layer, and forming a second layer of the contact dielectric layer above the sacrificial material layer. Additionally, the method includes, after forming the second layer, forming a buried conductive line in the contact dielectric layer below an upper surface of the second layer, the buried conductive line electrically contacting the gate electrodes of the at least two of the plurality of transistor elements.

An illustrative semiconductor device is also disclosed in accordance with the present subject matter and includes, among other things, a first transistor element and a second transistor element, a contact dielectric layer above the first and second transistor elements, a conductive element electrically connecting the first and second transistor elements, and a first metallization layer above the contact dielectric layer, wherein the conductive element is buried beneath an upper surface of the contact dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1:
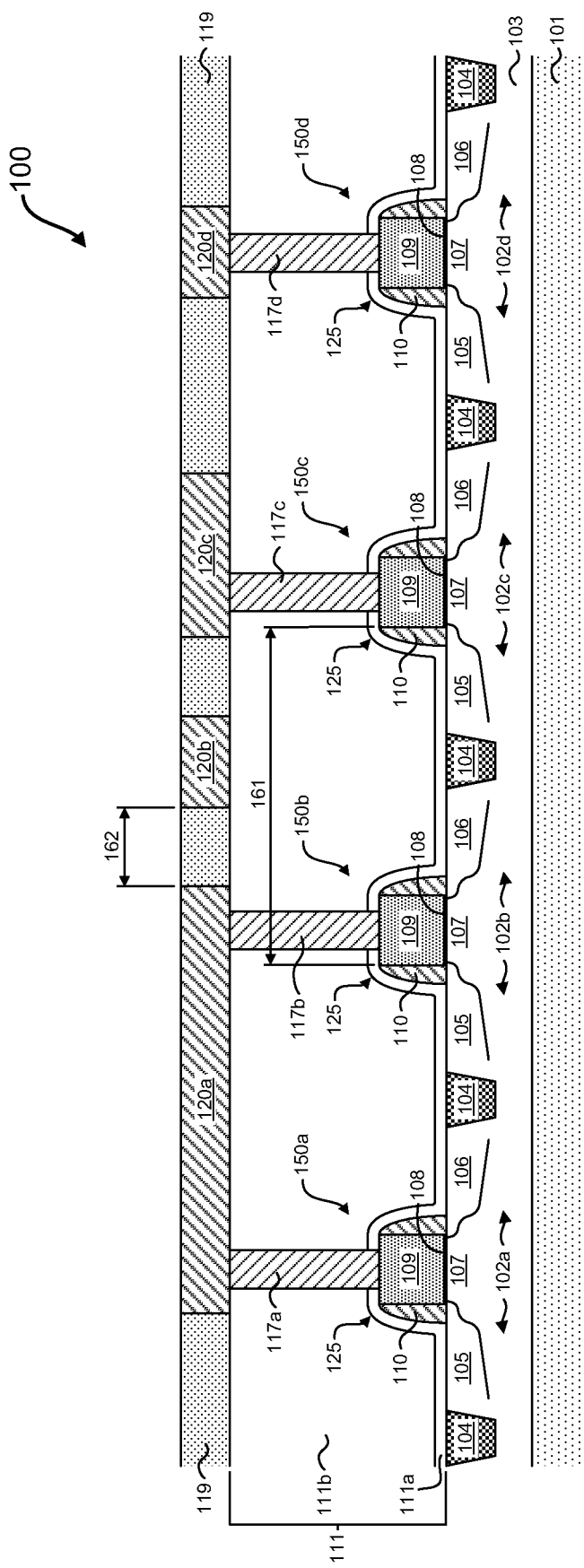
FIG. 1 schematically depicts an illustrative prior semiconductor device based on forming electrical interconnects in a first metallization layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the presently disclosed subject matter provides manufacturing techniques for forming electrical interconnects between transistor elements based on buried sublevel metallizations so as to improve the transistor density of semiconductor devices having a plurality of transistor elements, such as, for example, SRAM memory cells and the like, as well as semiconductor devices that formed based on the same. For example, in some 6T SRAM memory cells, electrical interconnects between the gate electrodes of adjacent transistors may be formed in the contact level of the semiconductor device, rather than as conventionally formed in the first metallization layer above the contact level, thereby freeing up at least some real estate in the first metallization layer for other wiring elements, such as conductive lines, to be formed. However, it should be noted that, after a complete reading of the present application, those skilled in the art will recognize that the illustrative techniques disclosed herein may be employed in manufacturing a variety of semiconductor devices other than the illustrative SRAM memory cells described above, such as, dual-port bit cells, read stable two port bit cells, logic circuits, and the like. Thus, the fact that the present subject matter may be disclosed in the context of forming conductive lines between the transistor elements of an illustrative SRAM memory device should not be considered as a limitation of the inventions disclosed herein.

It should be noted that, where appropriate, the reference numbers used in describing the various elements shown in the illustrative embodiments of FIGS. 2a-2l substantially correspond to the reference numbers used in describing the corresponding elements illustrated in FIG. 1 above, except that the leading numeral for has been changed from a "1" to a "2," as may be appropriate. For example, transistor element "100" corresponds to transistor element "200," the gate dielectric layer "108" corresponds to gate dielectric layer "208," the contact dielectric layer "111" corresponds to the contact dielectric layer "211," and so on. Accordingly, the reference number designations used to identify some elements of the presently disclosed subject matter may be illustrated in the FIGS. 2a-2l, but may not be specifically described in the following disclosure. In those instances, it should be understood that the numbered elements shown in FIGS. 2a-2l which are not described in detail below substantially correspond with their like-numbered counterparts illustrated in FIG. 1, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 100 depicted in FIG. 1a, it should be understood that the gate electrode structures 125 are formed "above" the active regions 102a-d, and the substrate 101 is positioned "below" or "under" the semiconductor layer 103. Similarly, it should also be noted that sidewall spacer structures 110 are positioned "adjacent to" the sidewalls of the electrodes 109, whereas in special cases, the spacer structures 110 may be positioned "on" the sidewalls of the gate electrodes 109 in those embodiments wherein no other layers or structures are interposed therebetween.

Figure 2A:
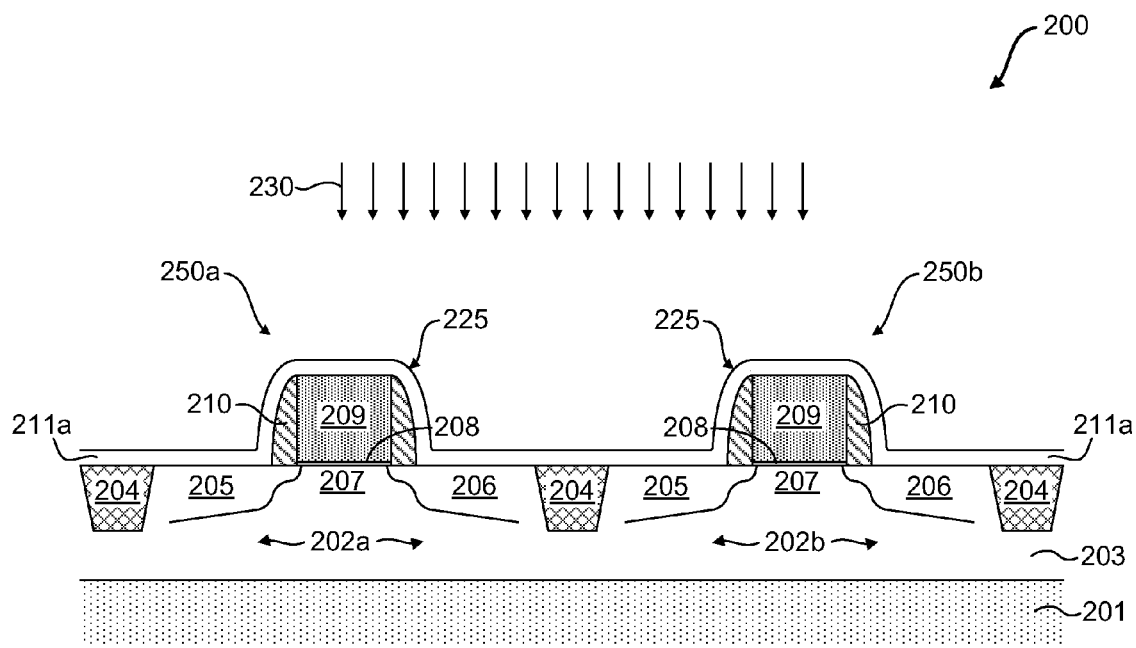
FIGS. 2a-2l schematically illustrate embodiments of an illustrative process flow of forming electrical interconnects in a buried sublevel metallization in accordance with the subject matter disclosed herein.

FIGS. 2a shows a schematic cross-sectional view of an illustrative semiconductor device 200 of the present disclosure during an intermediate manufacturing stage. The semiconductor device 200 of FIG. 2a may include, among other things, a substrate 201, in and above which illustrative first and second transistor elements 250a, 250b may be formed based on well-established semiconductor device processing techniques. For example, in some embodiments, the first and second transistor elements 250a, 250b may represent, for example, an NMOS pull-down transistor and a PMOS pull-up transistor, respectively, of a 6T SRAM memory cell device, as previously described. Furthermore, each transistor element 250a, 250b may include a gate electrode structure 225, and the substrate 201 may represent any appropriate substrate on which may be formed a semiconductor layer 203, such as a silicon-based layer, or any other appropriate semiconductor material that may facilitate the formation of the first and second MOS transistor elements 250a, 250d.

It should be appreciated that the semiconductor layer 203, even if provided as a silicon-based layer, may include other materials, such as germanium, carbon, and the like, in addition to an appropriate dopant species for establishing the requisite conductivity types in each of a first and second active regions 202a, 202b of the semiconductor layer 203. For example, in those illustrative embodiments wherein the first transistor element 250a comprises a pull-down NMOS transistor, the first active region 202a may include a dopant type of an opposite conductivity type—i.e., a P-type dopant species. Similarly, when the second transistor element 250b comprises, for example, a PMOS pull-up transistor, the second active region 202b of the semiconductor device 200 may include an N-type dopant species. It should be noted that, in some illustrative embodiments, the transistor elements 250a, 250b each may be formed as one of a plurality of bulk transistors, i.e., the semiconductor layer 203 may be formed on or be part of a substantially crystalline substrate material, while in other cases, certain device regions of the device 200—or the entire device 200—may be formed on the basis of a silicon-on-insulator (SOI) architecture, in which case a buried insulating layer (not shown) may be provided below the semiconductor layer 203.

Furthermore, the first and second active regions 202a, 202b may, depending on the specific device requirements, be enclosed by an isolation structure 204, which, in the illustrative embodiment shown in FIG. 2a, may be provided in the form of a shallow trench isolation as is typically used for sophisticated integrated circuits. In the illustrated semiconductor device 200, highly doped source regions 205 and drain regions 206 are formed in each of the first and second active regions 202a, 202b, corresponding to each of the first and second transistor elements 250a, 250b, respectively. Additionally, in some embodiments, the source and drain regions 205, 206 may also include lightly doped extension regions. The source and drain regions 205, 206, including any extension regions, are laterally separated by a channel region 207, which defines the gate length of the transistor elements 250a, 250b. The source and drain regions 205, 206 may also include, among other things, metal silicide contact regions (not shown), which may facilitate the formation of highly conductive electrical contacts to the contact regions of one or both of the transistor elements 250a, 250b. Each of the gate electrode structures 225 are formed above the channel regions 207 of the respective transistor elements 250a, 250b, and each includes a gate electrode 209, separated from the underlying channel region 207 by a gate dielectric layer 208. Additionally, depending on the overall device requirements and the process integration used to form the first and second transistor elements 250a, 250b, the gate electrode structures 225 may also include sidewall spacer structures 210 on or adjacent to the sidewalls of the gate electrodes 209. In some embodiments, the sidewall spacer structures for either or both transistor elements 250a, 250b may include one, two, or even more spacer elements, such as offset spacers, conformal liners, and the like, which may act as appropriate dopant implantation masks for creating the lateral dopant profile for the highly doped drain and source regions 205, 206, as well as any lightly doped extension regions.

Depending on the specific requirements of the semiconductor device 200, the first and second transistor elements 250a, 250b may in some illustrative embodiments be of a substantially similar design and configuration, whereas in other embodiments the transistor elements 250a, 250b may be of a substantially different design. For example, in some embodiments, both of the transistor elements 250a, 250b may be of the same conductivity type, such as NMOS or PMOS transistors, and furthermore may all be formed based upon the same integration process. In other embodiments, such as for example, when the semiconductor device 200 includes an inverter of and SRAM memory cell device, the transistor elements 250a, 250b may be based upon CMOS device architecture, wherein pairs of transistor elements include one each of an NMOS transistor and a PMOS transistor, as described above. Additionally, in some designs, one or both of the gate electrode structures 225 may be based upon conventional "polySiON" gate electrode configurations, wherein the gate electrodes 209 are generally formed from polysilicon material, and the gate dielectric layer 208 is formed from an oxide, such as silicon dioxide, silicon oxynitride, and the like. On the other hand, one or both of the gate electrode structures 225 may be based on an "HK/MG" gate electrode configuration, wherein the gate dielectric layer 208 comprises a high-k dielectric material and the gate electrode comprises one or more highly conductive metal layers.

In the manufacturing stage of the illustrative semiconductor device 200 depicted in FIG. 2a, a first dielectric material layer 211a of a contact dielectric layer 211 (see FIGS. 2h-2l) may be formed above the semiconductor device 200, including the first and second transistor elements 250a, 250b and the first and second active areas 202a, 202b. The first dielectric material layer 211a may be formed by performing a deposition process 230, which, in certain embodiments, may be a substantially conformal deposition process, such as a physical vapor deposition (PVD) process, a chemical vapor deposition (CVD), and atomic layer deposition process (ALD), and the like. Depending on the device requirements, the first dielectric material layer 211a may have a thickness ranging from 5-20 nm, whereas in certain embodiments the thickness may be between 8 nm and 12 nm. Furthermore, depending on the conductivity type of the transistor elements 250a, 250b, in certain illustrative embodiments the first dielectric material layer 211 a may have an intrinsic stress that is adapted to induce a stress in the channel regions 207 of the transistor elements 250a, 250b, which may thereby enhance overall device speed and performance.

In other illustrative embodiments, the first dielectric material layer 211a may also act as an etch stop layer so as to facilitate the later formation of via openings for forming contact elements to the various contact regions of the transistor elements 250a, 250b, as will be discussed in further detail below. In those embodiments wherein the first dielectric material layer 211a is adapted to act as an etch stop layer, the material of the first dielectric material layer 211a may exhibit an etch selectivity relative to the materials comprising the layers of the contact dielectric layer 211 (see FIGS. 2h-2l) formed above the first dielectric material layer 211a. For example, when the bulk of the contact material layer 211 includes a typical interlayer dielectric material, such as, for example, silicon dioxide, then the first dielectric material layer 211a may be, for example, silicon nitride. However, it should be noted that other material combinations also be used, provided the requisite etch selectivity may be obtained.

Figure 2B:
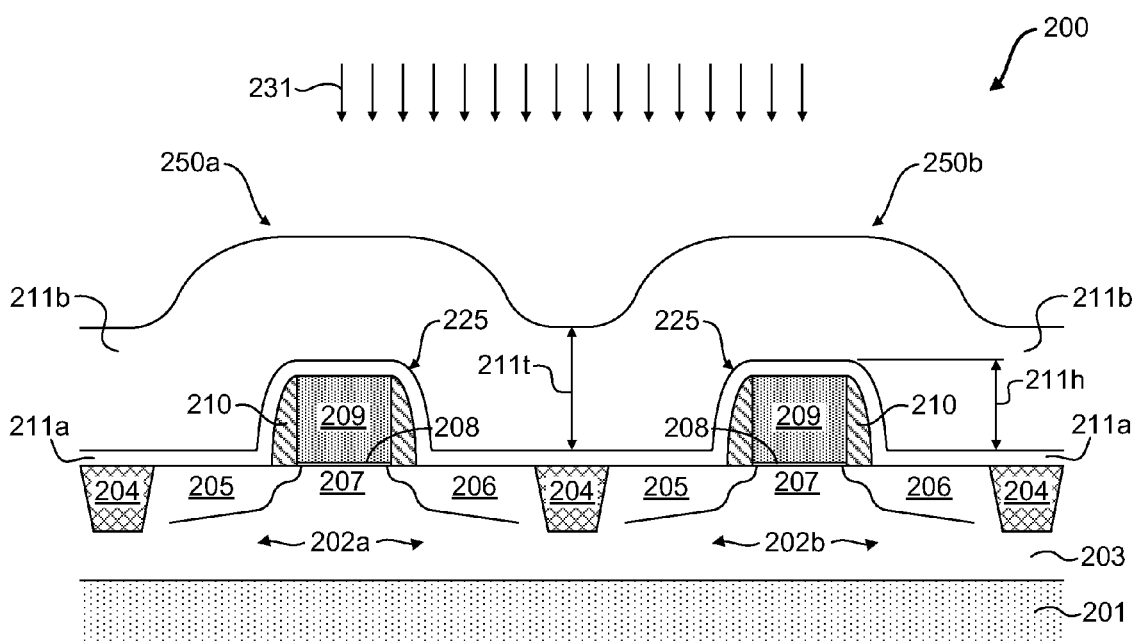
Figure 2C:
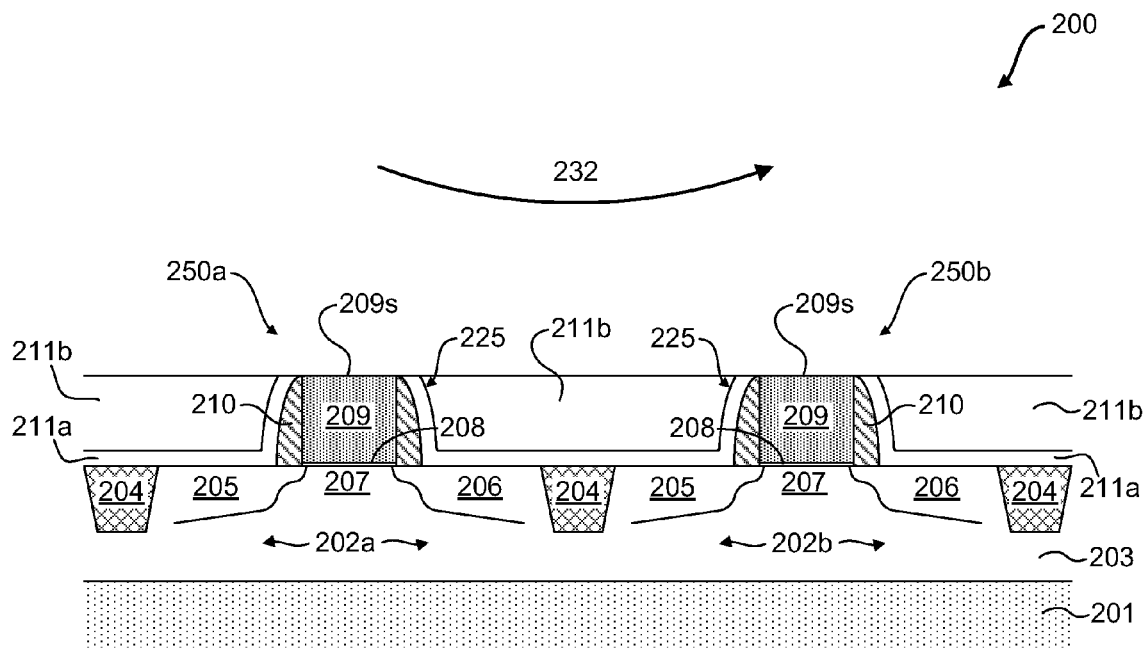

FIG. 2b schematically illustrates the semiconductor device 200 of FIG. 2a in a further advanced manufacturing stage, wherein a second dielectric material layer 211b may be formed above the first dielectric material layer 211a. In some embodiments of the present disclosure, the second dielectric material layer 211b may be formed to a thickness 211t by performing a deposition process 231. For example, when the second dielectric material layer 211b comprises silicon dioxide, the deposition process 231 may be a plasma enhanced chemical vapor deposition (PECVD) process based on tetraethyl orthosilicate (TEOS), which may have a high deposition rate as compared to other oxide deposition processes. Furthermore, in order to ensure that the space between adjacent gate electrode structures 225 is completely filled, the thickness 211t may, in some embodiments, be greater than the height 211h of the first dielectric material layer 211a covering each of the gate electrode structures 225. Thereafter, the semiconductor device 200 may be exposed to a planarization process 232, such as a chemical mechanical polishing (CMP) process, so as to planarize the first and second dielectric material layers 211a, 211b and to expose the upper surfaces 209s of the gate electrodes 209, as illustrated in FIG. 2c.

Figure 2D:
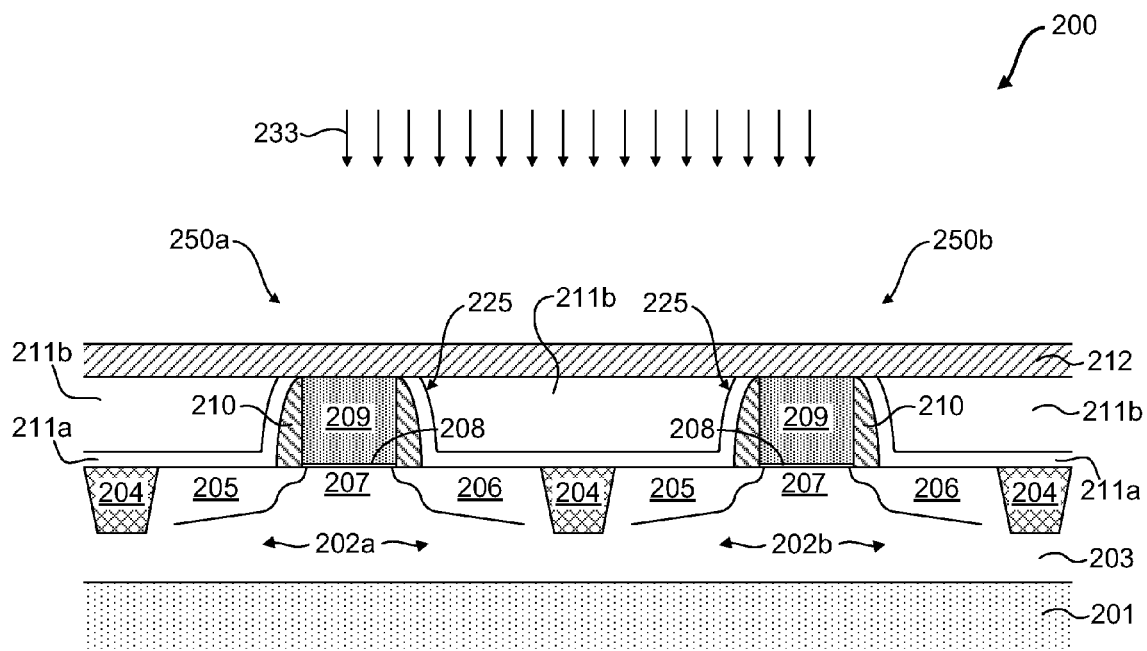

After completion of the planarization process 232, in some illustrative embodiments a sacrificial material layer 212 may be formed above the planarized surfaces of the semiconductor device 200, as shown in FIG. 2d. Depending on the device processing strategy, the sacrificial material layer 212 may be comprised of a material that exhibits etch selectively relative to at least one of the materials of the first and second dielectric material layers 211a, 211b, the gate electrodes 209, and any subsequent material layers formed above the sacrificial material layer 212, as later discussed with respect to the process sequences illustrated in FIGS. 2e-2j. In some illustrative embodiments, the sacrificial material layer 212 may include any one of several organic materials well known in the art, such as, for example, organic polyimides, and the like. Furthermore, the sacrificial material layer 212 may be formed by performing a suitably designed deposition process 233, such as CVD process, a spin-on deposition process, and the like. In certain embodiments, the thickness of the sacrificial material layer 212 may established based on the required size of a later-formed conductive line 218 that electrically connects the gate electrodes 209 of the first and second transistor elements 250a, 250b (see, FIG. 2l). For example, the thickness of the sacrificial material layer 212 may range on the order of 5 nm to 20 nm, whereas in at least one embodiment, the sacrificial material layer may be approximately 8-12 nm. However, other thicknesses may also be used, depending on the overall processing strategy, and the design requirements of the semiconductor device 200.

Figure 2E:
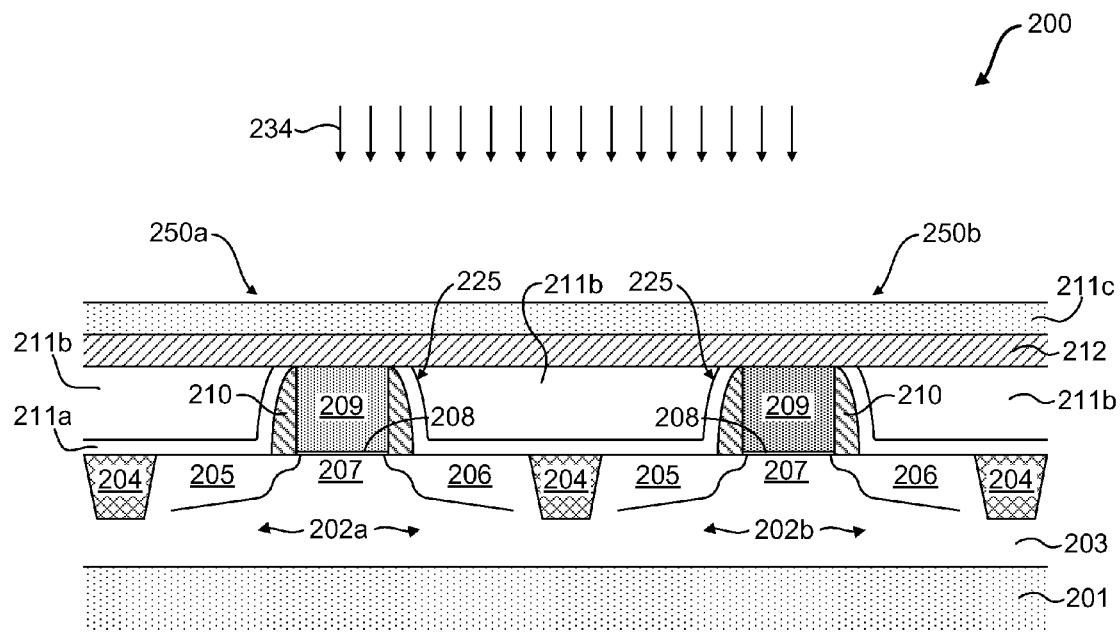

FIG. 2e schematically depicts the illustrative semiconductor device 200 of FIG. 2d in a subsequent manufacturing stage, wherein, in some embodiments, a third dielectric material layer 211c having a thickness ranging from approximately 5-20 nm may be formed above the sacrificial material layer 212. In certain embodiments of the presently disclosed subject matter, the third dielectric material layer 211c may be made of substantially the same material as the second dielectric material layer 211b, e.g., silicon dioxide, so as to therefore present the required etch selectivity relative to the sacrificial material layer 212, as previously described. However, the material of the third dielectric material layer 211c may also be different than that of the second dielectric material layer 211b, provided the sacrificial material layer 212 is similarly selectively etchable relative to the material of the third layer of dielectric material 211c.

Figure 2F:
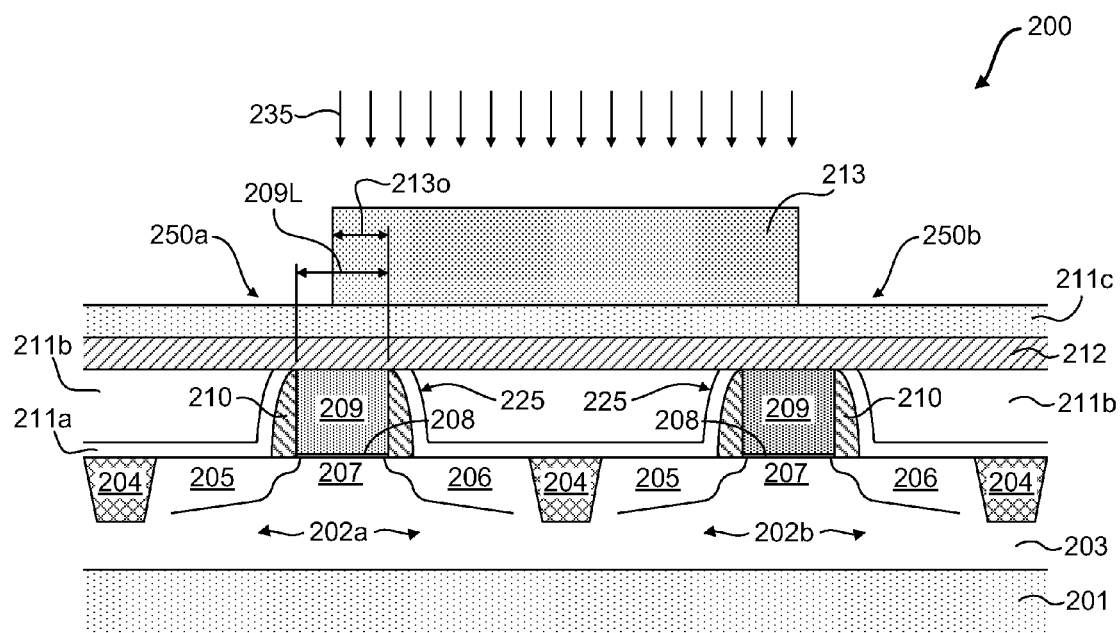

In subsequent manufacturing steps, a patterned etch mask 213 may be formed above the third dielectric material layer 211c, as shown in FIG. 2f, in preparation for patterning the third dielectric material layer 211c and the sacrificial material layer 212. The patterned etch mask 213 may be comprised of any one of several masking materials well known in the art, such as a photoresist material and the like, and may also be formed by a variety of well-known techniques. For example, in at least one illustrative embodiment, wherein the patterned etch mask 213 is a layer of photoresist material, the patterned etch mask 213 may be formed using traditional photolithography techniques, such as spin-on coating, soft-bake, exposure, hard bake and develop, and the like. Other materials and processes may also be employed.

It should be noted that the extent of the patterned etch mask 213 illustrated in FIG. 2f may be established such that the patterned etch mask 213 overlaps only a portion of each of the gate electrodes 209 of each transistor element 250a, 250b, but wherein the amount of overlap 213o does not exceed the length 209L of the gate electrodes 209. Accordingly, when the third dielectric material layer 211c and the sacrificial material layer 212 are patterned based on the patterned etch mask 213 during a subsequently performed etch process 235, a first portion 209c of the upper surface of each gate electrode 209 will remain covered, whereas a second portion 209e will be exposed (see, FIG. 2g).

In some illustrative embodiments disclosed herein, the semiconductor device 200 depicted in FIG. 2f may be exposed to an etch process 235 so as to pattern the material stack of the sacrificial material layer 212 and the third dielectric material layer 211c above the first and second transistor elements 250a, 250b. In certain embodiments, the etch process 235 may be a substantially anisotropic etch process, such as a plasma etch process, whereas in at least one embodiment, the etch process 235 may be a reactive ion etch (RIE) process. Furthermore, the etch recipe used to perform the etch process 235 may be adjusted as required to remove each of the different materials which may make up the third dielectric material layer 211c and the sacrificial material layer 212, and furthermore to stop when the planarized surface of the first and second dielectric material layers 211a, 211b and the second portion 209e of the upper surface of each gate electrode 209 has been exposed.

Figure 2G:
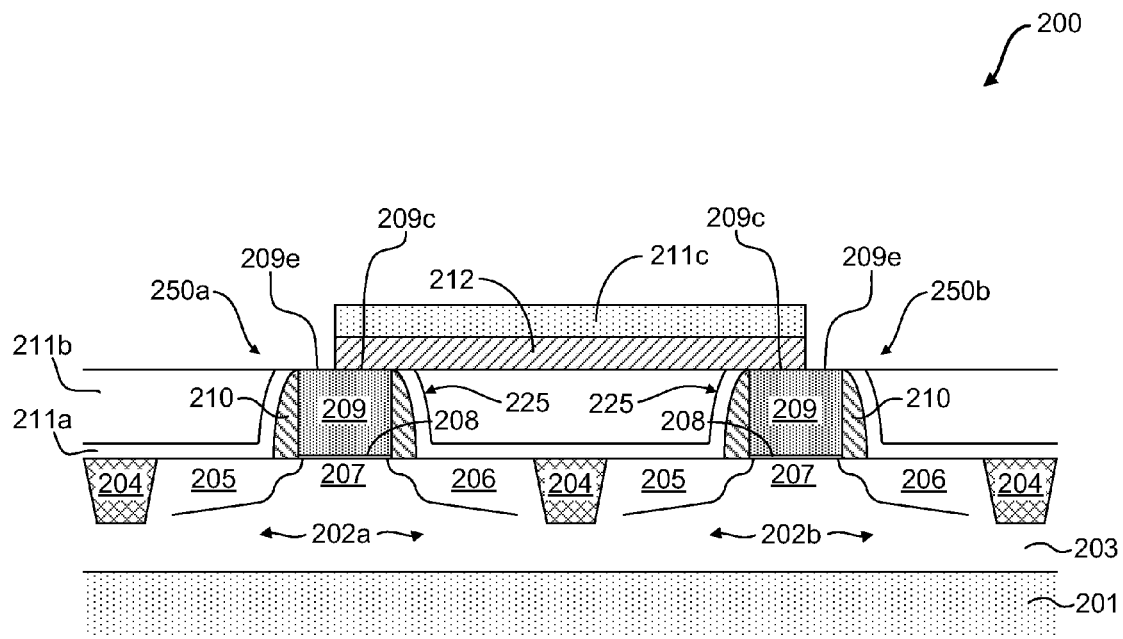
Figure 2H:
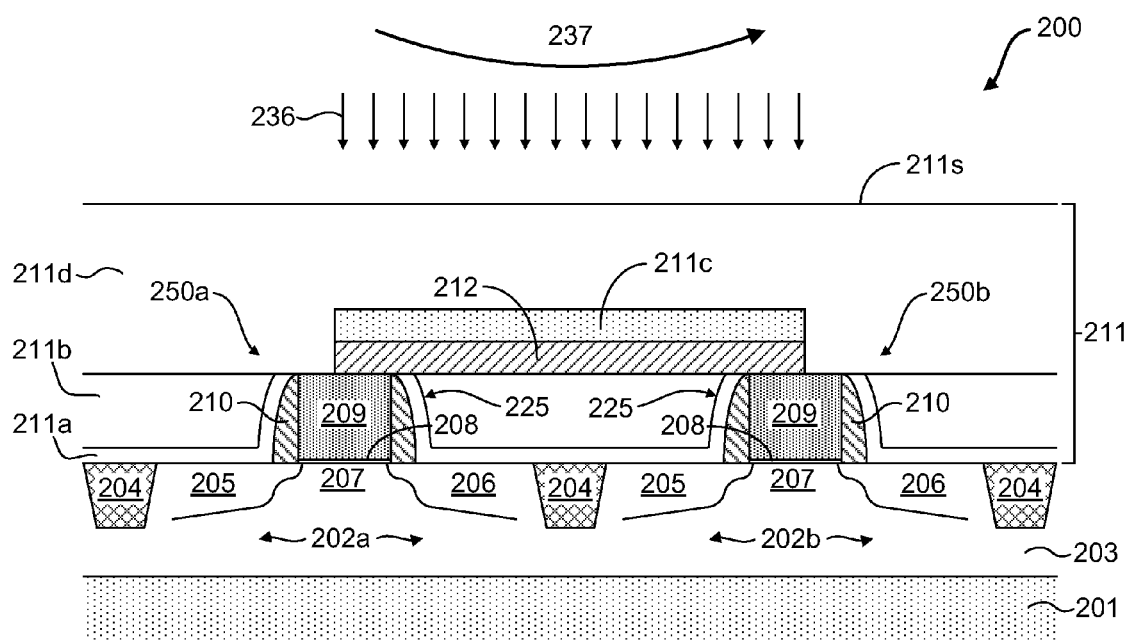

FIG. 2g schematically illustrates the semiconductor device 200 depicted in FIG. 2f after the material stack of the sacrificial material layer 212 and the third dielectric material layer 211c above the first and second transistor elements 250a, 250b has been patterned, and the patterned etch mask has been removed. As shown in FIG. 2g, a first portion 209c of each gate electrode 209 remains covered, whereas a second portion 209e of each gate electrode 209 has been exposed. Thereafter, in some illustrative embodiments, a deposition process 236 may be performed to deposit a fourth dielectric material layer 211d above the semiconductor device 200, as shown in FIG. 2h. In certain embodiments, the fourth dielectric material layer 211d may be made of substantially the same material as the first and second dielectric material layers 211a, 211b, e.g., silicon dioxide, so as to therefore provide the required etch selectivity relative to the sacrificial material layer 212, as previously described. In those embodiments wherein the fourth dielectric material layer 211d comprises silicon dioxide, the deposition process 236 may be, for example, a PECVD process based on TEOS. In still other embodiments, the material of the fourth dielectric material layer 211d may be different than that of either the first and second dielectric material layers 211a, 211b, provided, however, that the sacrificial material layer 212 is similarly selectively etchable relative to the material making up the fourth layer of dielectric material 211d. Thereafter the fourth dielectric material layer 211d is exposed to a planarization process 237, such as a CMP process and the like, so as to planarize the upper surface 211s of the fourth dielectric material layer 211d, and thereby completing the formation of the contact dielectric layer 211.

Figure 2I:
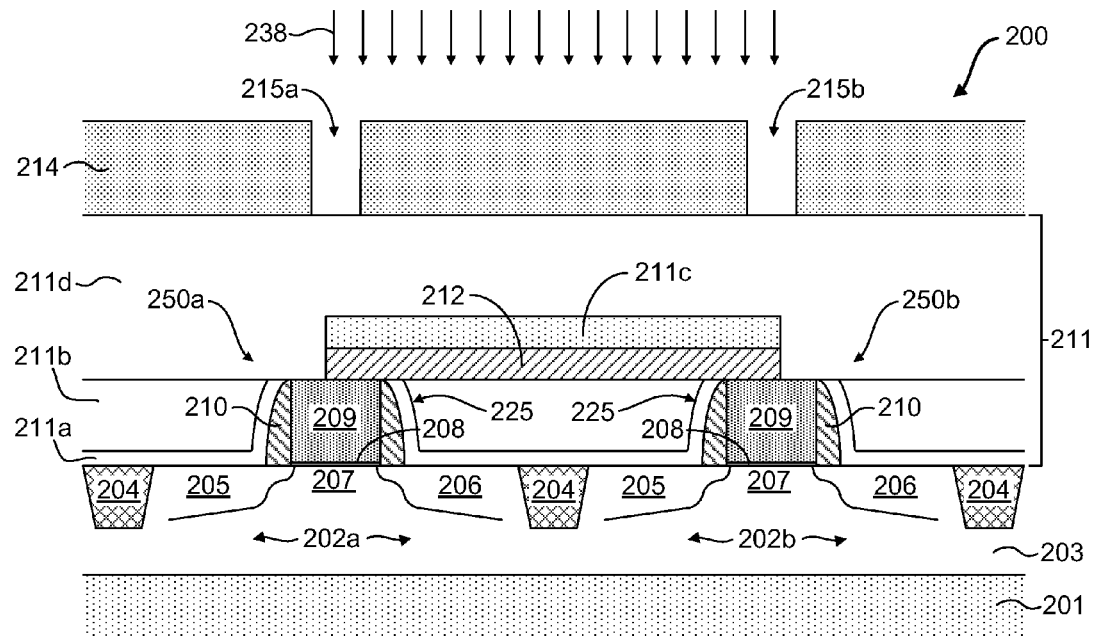

FIG. 2i schematically illustrates the semiconductor device 200 of FIG. 2h in a subsequent processing stage, wherein a patterned etch mask 214 has been formed above the fourth dielectric material layer 211d in preparation for patterning via openings in the contact dielectric layer 211. In some illustrative embodiments, the patterned etch mask 214 may be performed using techniques that are well known in the art, such as a photoresist mask and the like as previously described with respect to FIG. 2f above. As shown in the FIG. 2i, the patterned etch mask 214 may include openings 215a and 215b, which are sized and positioned so as to form via openings in the contact dielectric layer 211 so as to expose the gate electrodes 209 of the first and second transistor elements 250a and 250b, respectively. After the patterned etch mask 214 has been formed, an etch process 238 may be performed so as to extend the openings 215a, 215b into the contact dielectric layer 211. In some embodiments of the present disclosure, the etch process 238 may include, for example, an anisotropic plasma etch process, such as an RIE process and the like. Furthermore, in certain illustrative embodiments, the etching parameters used to perform the etch process 238 may be designed so as to form via openings having sidewalls that are substantially straight and perpendicular to the plane of the substrate 201, thereby ensuring a substantially uniform contact via cross-section.

Figure 2J:
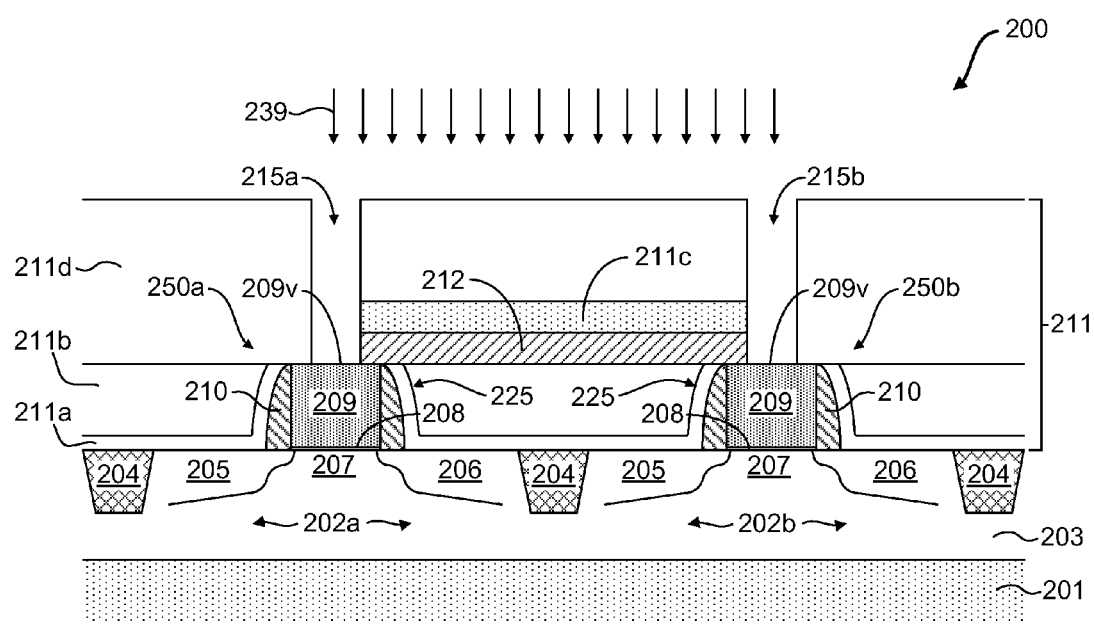

FIG. 2j shows the illustrative semiconductor device 200 of FIG. 2i in yet a further stage of device manufacture, after completion of the etch process 238. As shown in FIG. 2j, via openings 215a, 215b have been extended into the contact dielectric layer 211, thereby exposing upper contact surfaces 209v of the gate electrodes 209 at the bottom of each via opening 215a, 215b. Thereafter, the semiconductor device 200 may be exposed to a wet chemical cleaning process 239 adapted to selectively remove the material of the sacrificial material layer 212 relative to the materials making up the contact dielectric layer 211 and the gate electrode structures 225. In some illustrative embodiments, the wet chemical cleaning process 239 may be any one of several recipes well known in the art for selectively removing organic polyimides, such as, for example, a mixture of ammonia and hydrogen peroxide, sometimes referred to as "APM," or ammonia peroxide mixture (APM), or a mixture of sulfuric acid and hydrogen peroxide, sometimes referred to "SPM," or sulfuric peroxide mixture, and the like. Other recipes may also be used.

Figure 2K:
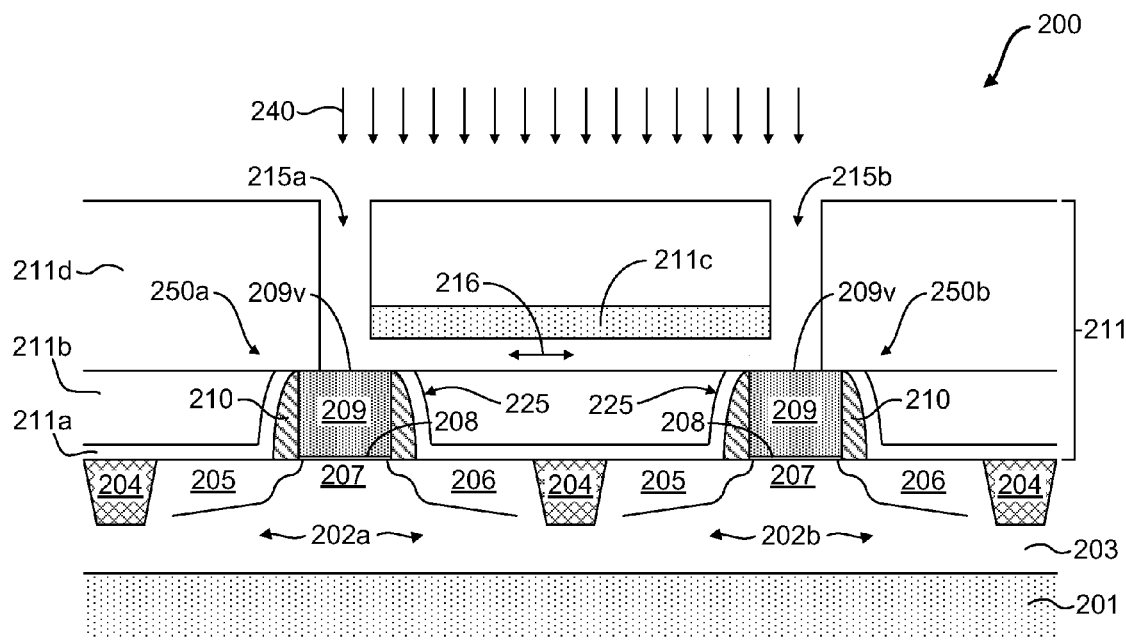

FIG. 2k schematically illustrates the illustrative semiconductor device 200 after completion of the wet chemical cleaning process 239, wherein a substantially horizontally oriented opening or cavity 216 has been formed in the contact dielectric layer 211 between the via openings 215a and 215b. Due to the selective removal of the sacrificial material layer 212 relative to the surrounding materials during the wet chemical cleaning process 238, the cavity 216 may have a well-defined geometry, i.e., substantially the size and shape of the sacrificial material layer 212. Therefore, as shown in FIG. 2k, a continuous opening has been formed in the contact dielectric layer 211, connecting the gate electrodes 209 of the first and second transistor elements 250a, 250b to each other, as well as to a metallization layer 219 (see, FIG. 2l) to be formed above the contact dielectric layer 211 in subsequent manufacturing stages. As shown in FIG. 2k, a deposition process 240 may thereafter be performed so as to fill the each of the via openings 215a, 215b and the cavity 216 with a conductive material, thereby forming an electrically continuous conductive element in the contact dielectric layer 211. In some illustrative embodiments, the deposition process 240 may include a highly optimized CVD process, such as an ALD process and the like, so as to ensure that via openings 215a, 215b and cavity 216 are filled without creating any significant void regions. Furthermore, in certain embodiments, the material used to fill the via openings 215a, 215b and cavity 216 may include, for example, a highly conductive metal, such as tungsten and the like. Moreover, in at least some embodiments, a liner or barrier layer (not shown) may be formed on the surfaces of the via openings 215a, 215b and the cavity 216 so as to promote adhesion of the highly conductive fill material, or to reduce the possibility of material diffusion into the surrounding dielectric materials.

Figure 2L:
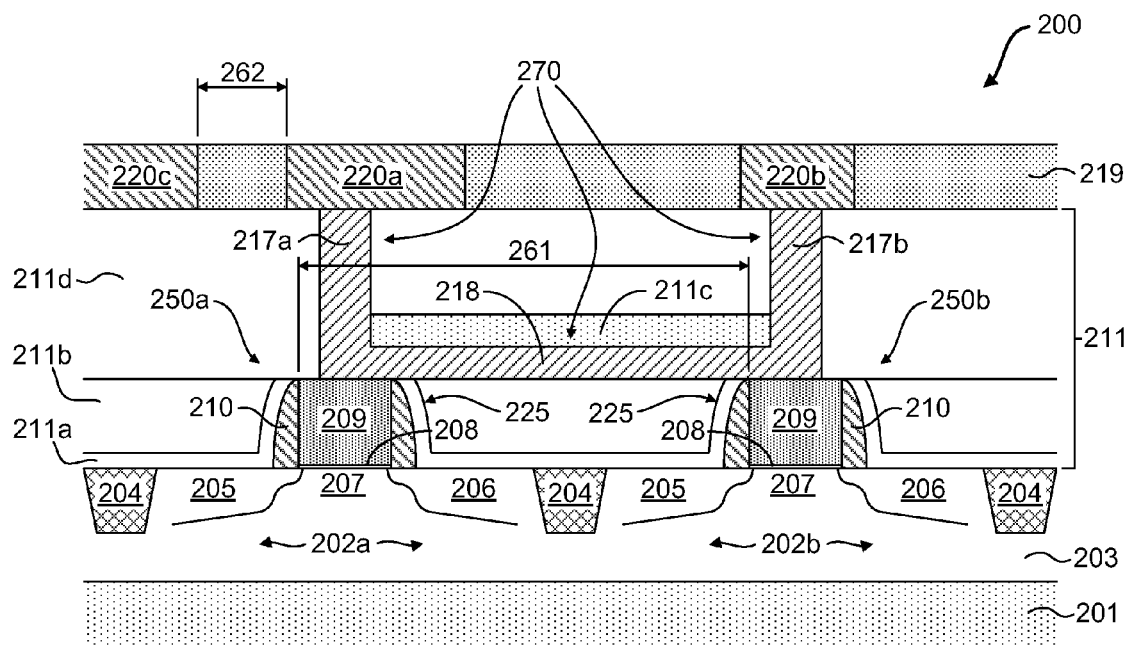

FIG. 2l schematically depicts the semiconductor device 200 in an advance manufacturing stage after completion of the deposition process 240, wherein contact vias 217a, 217b have been formed in via openings 215a, 215b, respectively, and conductive line 218 has been formed in cavity 216. As shown in FIG. 2l, the contact vias 217a, 217b and the conductive line 218 are joined so as to provide a continuous conductive element 270. In some embodiments, the semiconductor device 200 of FIG. 2l may also include, among other things, a first metallization layer 219 formed above the contact dielectric layer 211, and which may include a plurality of substantially horizontally oriented conductive lines defining one or more of a variety of circuit layouts, such as, for example, conductive lines 220a-c. In certain illustrative embodiments, the conductive lines 220a-c may comprise a highly conductive metal, such as copper or copper alloys, and the like, as may be typically used in the metallization layers of state of the art semiconductor devices. It should be noted that, since the conductive line 218 is formed in the contact dielectric layer 211 rather than in the first metallization layer 219 as may typically be the case (see, e.g., FIG. 1, as described above), there may be more area available within the first metallization layer to route the requisite conductive lines. Moreover, the use of a buried sublevel metallization, such as the conductive line 218, rather than creating an electrical interconnect between adjacent transistor elements in the first level metallization, may facilitate a smaller gate electrode pitch 261 between adjacent gate electrodes 209 while still maintaining a minimum required spacing 262 between adjacent conductive lines in the first metallization layer 219, as may be necessary to avoid undue parasitic capacitance effects.

As a result, the subject matter disclosed herein provides manufacturing techniques for forming sublevel metallizations—e.g., electrical interconnects below the first level metallization—having a well-defined geometry, as well as semiconductor devices utilizing sublevel metallizations based on the same. Moreover, the use of sublevel metallizations formed in accordance with the present disclosure may facilitate an improved transistor densities for at least some semiconductor devices comprising a plurality of transistor elements, such as SRAM memory cells, and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first layer of a contact dielectric layer above a plurality of transistor elements of a semiconductor device, each of said plurality of transistor elements comprising a gate electrode;
   planarizing said first layer to expose an upper surface of said gate electrode of at least two of said plurality of transistor elements;
   forming a sacrificial material layer above said planarized first layer;
   forming a second layer of said contact dielectric layer above said sacrificial material layer; and
   after forming said second layer, forming a buried conductive line in said contact dielectric layer below an upper surface of said second layer, said buried conductive line electrically contacting said gate electrodes of said at least two of said plurality of transistor elements.

2. The method of claim 1, wherein forming said buried conductive line comprises forming a cavity below an upper surface of said second layer, said cavity extending between said gate electrodes of said at least two of said plurality of transistor elements.

3. The method of claim 2, wherein forming said cavity comprises selectively removing said sacrificial material from above said at least said two of said plurality of transistor elements.

4. The method of claim 3, wherein selectively removing said sacrificial material layer comprises performing a selective wet chemical cleaning process to selectively remove material of said sacrificial material layer relative to material of said contact dielectric layer.

5. The method of claim 2, forming said cavity comprises forming via openings in said contact dielectric layer to expose at least a portion of an upper surface of said gate electrodes of said at least two of said plurality of transistor elements.

6. The method of claim 5, wherein forming said buried conductive element comprises performing a common deposition process to fill said cavity and said via openings with a conductive material.

7. The method of claim 6, further comprising forming a first metallization layer above said contact dielectric layer.

8. The method of claim 7, further comprising forming at least one conductive element in said first metallization layer in electrical contact with at least one of said filled via openings.

9. The method of claim 1, further comprising forming a third layer of said contact dielectric layer above said sacrificial material layer prior to forming said second layer.

10. The method of claim 9, wherein performing said common deposition process comprises performing an atomic layer deposition process.

11. The method of claim 1, further comprising forming an etch stop layer above said plurality of transistor elements prior to forming said first layer.

12. A method, comprising:
   forming a contact dielectric layer above first and second transistor elements of a semiconductor device;
   forming a substantially horizontally oriented buried cavity in said contact dielectric layer, said buried cavity having first and second open end regions adjacent to first and second gate electrodes of said respective first and second transistor elements and a top surface that is covered by a portion of said contact dielectric layer; and
   forming a buried conductive line in said buried cavity, said buried conductive line conductively contacting a first contact surface of said first gate electrode and a second contact surface of said second gate electrode.

13. The method of claim 12, further comprising forming first and second via openings to expose said first and second contact surfaces of said respective first and second gate electrodes, said first and second open via openings connecting with said substantially horizontally oriented buried cavity at said respective first and second open end regions.

14. The method of claim 13, further comprising forming first and second conductive contact vias in said respective first and second via openings, said first and second contact vias conductively contacting said respective first and second contact surfaces.

15. The method of claim 14, wherein said buried conductive line and said first and second conductive contact vias are formed during a common material deposition process.

16. The method of claim 12, wherein said portion of said contact dielectric layer covering said top surface of said substantially horizontally oriented buried cavity comprises a first dielectric material layer and a second dielectric material layer formed above said first dielectric material layer.

17. The method of claim 16, wherein forming said substantially horizontally oriented buried cavity comprises performing an etching process to selectively remove a sacrificial material layer from below said first dielectric material layer.

* * * * *